(12) United States Patent
Inujima et al.

(10) Patent No.: US 6,677,001 B1
(45) Date of Patent: Jan. 13, 2004

(54) MICROWAVE ENHANCED CVD METHOD AND APPARATUS

(75) Inventors: Takashi Inujima, Atsugi (JP); Naoki Hirose, Atsugi (JP); Mamoru Tashiro, Tokyo (JP); Shunpei Yamazaki, Tokyo (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 1,826 days.

(21) Appl. No.: 08/470,596

(22) Filed: Jun. 6, 1995

Related U.S. Application Data (62) Division of application No. 07/993,523, filed on Dec. 21, 1992, which is a continuation of application No. 07/366,364, filed on Jun. 15, 1989, now abandoned, which is a continuation of application No. 07/114,203, filed on Oct. 29, 1987, now abandoned.

(30) Foreign Application Priority Data

| Nov. 10, 1986 | (JP) | ............................................ 61-266834 |
| Jan. 5, 1987 | (JP) | .......................................... 62-0002981 |

(51) Int. Cl.$^7$ .............................. H05H 1/46; H05H 1/18; C23C 16/26; C23C 16/34; C23C 16/40
(52) U.S. Cl. ........................ 427/575; 427/572; 427/573; 427/577; 505/477
(58) Field of Search ......................... 118/723 MA, 725; 156/345; 427/562, 564, 571, 573, 572, 575, 577, 576; 505/325, 400, 445, 447, 470, 473, 477, 480

(56) References Cited

U.S. PATENT DOCUMENTS

| 3,661,637 A | * | 5/1972 | Sirtl | .......................... 118/725 |
| 3,911,318 A | * | 10/1975 | Spero | .......................... 315/39 |
| 4,047,496 A | * | 9/1977 | McNeilly et al. | ............ 118/725 |
| 4,401,054 A | * | 8/1983 | Matsuo et al. | ............... 427/571 |
| 4,438,368 A | * | 3/1984 | Abe et al. | ............. 118/723 MR |

(List continued on next page.)

FOREIGN PATENT DOCUMENTS

| EP | 0046945 | | 3/1982 | |
| JP | 56-155535 | | 12/1981 | |
| JP | 59-63732 | * | 4/1984 | ................. 423/446 |
| JP | 59-063732 | | 4/1984 | |
| JP | 103098 | * | 6/1985 | ................. 423/446 |

(List continued on next page.)

OTHER PUBLICATIONS

Kawarada et al, "Large Area CVD of Diamond Particles and Films Using Magneto–Microwave Plasma", *Jap. Journal of Appl Physics*, vol. 26, #6 p. L1032–L1034 Jun. 1987.*

McGraw–Hill Encyclopedia of Science and Technology, vol. 6, pp. 387–388, ©1960, New York.*

"Large Area Chemical Vapour Deposition of Diamond Particles and Films Using Magneto–Microwave Plasma" Japanese Journal of Applied Physics, vol. 26, No. 6, Jun., 1987, pp 1032–L1034, Hiroshi Kawarada et al.

(List continued on next page.)

*Primary Examiner*—Marianne Padgett
(74) *Attorney, Agent, or Firm*—Nixon Peabody LLP; Jeffrey L. Costellia (57) ABSTRACT

A new chemical vapor reaction system is described. Instead of ECR where electrons can move as independent particles without interaction, a mixed cyclotron resonance is a main exciting principal for chemical vapor reaction. In the new proposed resonance, the resonating space is comparatively large so that a material having a high melting point such as diamond can be deposited in the form of a thin film by this inovative method.

43 Claims, 4 Drawing Sheets

U.S. PATENT DOCUMENTS

| | | | | |
|---|---|---|---|---|
| 4,481,229 A | * | 11/1984 | Suzuki et al. | 427/571 |
| 4,503,807 A | * | 3/1985 | Nakayama | 118/725 |
| 4,513,684 A | * | 4/1985 | Nath et al. | 427/572 |
| 4,532,199 A | * | 7/1985 | Ueno et al. | 427/571 |
| 4,559,100 A | * | 12/1985 | Ninomiya et al. | 156/643 |
| 4,563,240 A | * | 1/1986 | Shibata et al. | 156/643 |
| 4,636,401 A | * | 1/1987 | Yamazaki et al. | 118/719 |
| 4,640,224 A | * | 2/1987 | Bunch | 118/723 |
| 4,657,776 A | * | 4/1987 | Dietrich et al. | 427/576 |
| 4,727,293 A | * | 2/1988 | Asmussen et al. | 315/111.41 |
| 4,776,918 A | * | 10/1988 | Otsubo | 156/345 |
| 4,869,923 A | * | 9/1989 | Yamazaki | |
| 4,876,983 A | * | 10/1989 | Fukada et al. | |
| 4,973,494 A | | 11/1990 | Yamazaki | |
| 5,015,494 A | * | 5/1991 | Yamazaki | |
| 5,162,296 A | * | 11/1992 | Yamazaki | 427/576 |
| 5,266,363 A | * | 11/1993 | Yamazaki | 427/575 |

FOREIGN PATENT DOCUMENTS

| | | | | |
|---|---|---|---|---|
| JP | 60-103098 | * | 6/1985 | |
| JP | 60-134423 | | 7/1985 | |
| JP | 0036200 | * | 2/1986 | |
| JP | 61- 36200 | * | 2/1986 | |
| JP | 61-36200 | * | 2/1986 | 423/446 |
| JP | 61-0036200 | | 2/1986 | |
| JP | 0150219 | * | 6/1986 | 156/345 |
| JP | 61-150219 | * | 7/1986 | |
| JP | 61-158898 | * | 7/1986 | |
| JP | 61-0150219 | | 7/1986 | |
| JP | 096397 | * | 5/1987 | 423/446 |
| JP | 62-96397 | * | 5/1987 | |
| JP | 60-234403 | * | 5/1987 | |
| JP | 62-096397 | * | 5/1987 | 423/446 |
| JP | 63-225528 | * | 9/1988 | |
| JP | 1-59729 | * | 3/1989 | |
| JP | 1-73776 | * | 3/1989 | |

OTHER PUBLICATIONS

"Large Area Chemical Vapour Deposition of Diamond Particles and Films Using Magneto–Microwave Plasma" Japanese Journal of Applied Physics, vol. 26, No. 6, Jun., 1987, pp 1032–L1034, Hiroshi Kawarada et al.

Konuma, "Basics of Plasma and Film Formation", pp. 70–71, pp 176–177, Aug. 29, 1986. Concise Statement, published by Nikkan Kogyo.

Tokiguchi et al., "Formation of Carbon Films by Microwave Discharge Plasma in a Magnetic Field" pp. 187/26a–A–8, Sep. 1983, The Japan Society of Applied Physics, Extended Abstracts, Concise Statement.

Nikkei Microdevice, Concise Statement, pp. 93–100, Feb. 4, 1985.

McGraw Hill Encyclopedia of Science and Technology, vol. 6, pp. 387–388, 1960 New York no month.

* cited by examiner

|B₁| (Gauss)

|E| (V/m)

FIG. 4

MICROWAVE ENHANCED CVD METHOD AND APPARATUS

This is a Divisional application of Ser. No. 07/993,523 filed Dec. 21, 1992; which itself is a continuation of Ser. No. 07/366,364 filed Jun. 15, 1989 now abandoned; which is a continuation of Ser. No. 07/114,203 filed Oct. 29, 1987.

BACKGROUND OF THE INVENTION

This invention relates to a microwave enhanced method and an apparatus therefor.

Recently, electron cyclotron resonance chemical vapor deposition (ECR CVD) has attracted the interests of researchers as a new method of manufacturing thin films, particularly amorphous thin films. For example, Matsuo et al discloses one type of such a ECR CVD apparatus in U.S. Pat. No. 4,401,054. This recent technique utilizes microwaves to energize a reactive gas into a plasma state by virtue of a magnetic field which functions to pinch the plasma gas within the excitation space. With this configuration, the reactive gas can absorb the energy of the microwaves. A substrate to be coated is located distant from the excitation space (resonating space) for preventing the same from being sputtered.) The energized gas is showered on the substrate from the resonating space. In order to establish an electron cyclotron resonance, the pressure in a resonating space is kept at $1 \times 10^{-3}$ to $1 \times 10^{-5}$ Torr at which electrons can be considered as independent particles, and resonate with a microwave in an electron cyclotron resonance on a certain surface on which the magnetic field takes a particular strength required for ECR. The excited plasma is extracted from the resonating space, by means of a divergent magnetic field, to a deposition space which is located distant from the resonating space and in which is disposed a substrate to be coated.

In such a prior art method, it is very difficult to form a thin film of a polycrystalline or single-crystalline structure, so that currently available methods are almost limited to processes for manufacturing amourphous films. Also, high energy chemical vapor reaction is difficult to take place in accordance with such a prior art method and therefore a diamond film or other films having high melting points, or uniform films on an even surface having depressions and caves can not be formed.

SUMMARY OF THE INVENTION

It is therefore an object of the invention to provide a microwave enhanced CVD method and an apparatus therefor capable of forming a film, which can not be formed by the prior art method, such as a diamond film, or a film of a material having a high melting point.

According to one aspect of the invention, the surface of an object to be coated is located in a region of a resonating space in which the electric field of a microwave takes its maximum value. By this configuration, the deposition can be carried out while the deposited film is being partially sputtered, and therefore, e.g., a diamond film can be formed.

According to another aspect of the invention, a new CVD process has been achieved. The new Process utilizes a mixed cyclotron resonance which was derived first by the inventors. In the new type of exciting process, interaction of reactive gas itself must be taken into consideration as a non-negligible perturbation besides the magnetic field and microwave, and therefore charged particles of a reactive gas can be absorbed in a relatively very wide resonating space. For the mixed resonance, the pressure in a reaction chamber is elevated $10^2-10^5$ times as high as that of the prior art method.

DETAILED DESCRIPTION OF THE PREFERRED EMBODIMENTS

Figure 1:
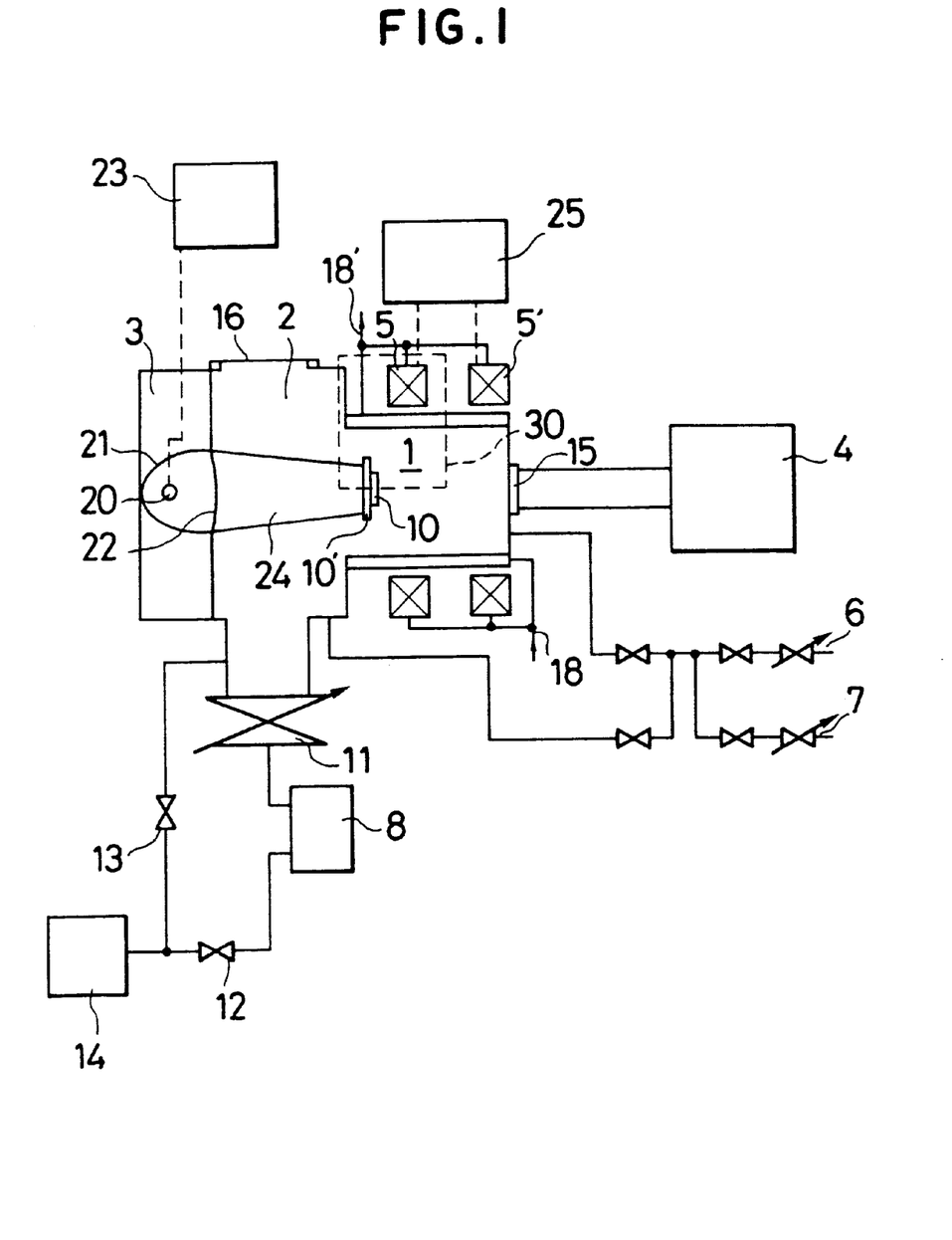
FIG. 1 is a cross section view showing a CVD apparatus in accordance with the present invention.

Referring to FIG. 1, a microwave enhanced plasma CVD apparatus accordance pith the present invention is illustrated. In the figure, the apparatus comprises a reaction chamber in which a plasma generating space 1 and an auxiliary space 2 are defined and can be held at an appropriate pressure, a microwave generator 4, electro-magnets 5 and 5' in the form of solenoids surrounding the space 1, a power supply 25 for supplying an electric power to the electro-magnets 5 and 5', and a water cooling system 18. The plasma generating space 1 has a circular cross section. In the plasma generating space 1, a substrate holder 10' made of a highly thermal conductive ceramic such as aluminum nitride is provided on which a substrate 10 is mounted. The substrate holder 10' is irradiated and heated to 150–1000° C. with an infrared light 24, which is emitted from an IR heater 20, reflected from an IR reflection parabola mirror 21 and focused on the back surface of the holder 10' through a lens 22. A reference numeral 23 designates a power supply for the IR heater 20. Provided for evacuating the reaction chamber is an evacuating system comprising a turbo molecular pump 8 and a rotary pump 14 which are connected with the reaction chamber through pressure controlling valves 11, 12 and 13. The substrate temperature may reach a sufficient value only with the plasma gas generated in the reaction chamber. In this case, the heater can be dispensed with. Further, depending on the condition of the plasma, the substrate temperature might elevate too high to undergo a suitable reaction. In the case, cooling means has to be provided. The process with this apparatus is carried out as follows.

A substrate 10 is mounted on the substrate holder 10' and heated by infrared light 24 to 500° C. Then, hydrogen gas is introduced from a gas introducing system 6 at 10 SCCM, and a microwave of 1 Kilo Gauss or stronger, e.g., 2.45 GHz is emitted from the microwave generator thorough a microwave introduction window 15 to the plasma generating space 1 which is subjected to a magnetic field of about 2 K Gauss induced by the magnets 5 and 5'. The hydrogen is excited in a high density plasma state in the space 1 by the energy of the microwave. The surface of the substrate is cleaned by high energy electrons and hydrogen atoms. In addition to the introduction of the hydrogen gas, $C_2H_2$ and $CH_4$ are inputted through an introduction system 7, and excited by the energy of microwave at 1–800 Torr in the same manner as carried out with hydrogen explained in the foregoing description. As a result of a chemical vapor reaction, carbon is deposited in the form of a diamond film or an i-carbon (insulated carbon) film. The i-carbon is comprised of a mixture of diamond and amorphous carbon.

Figure 2A:
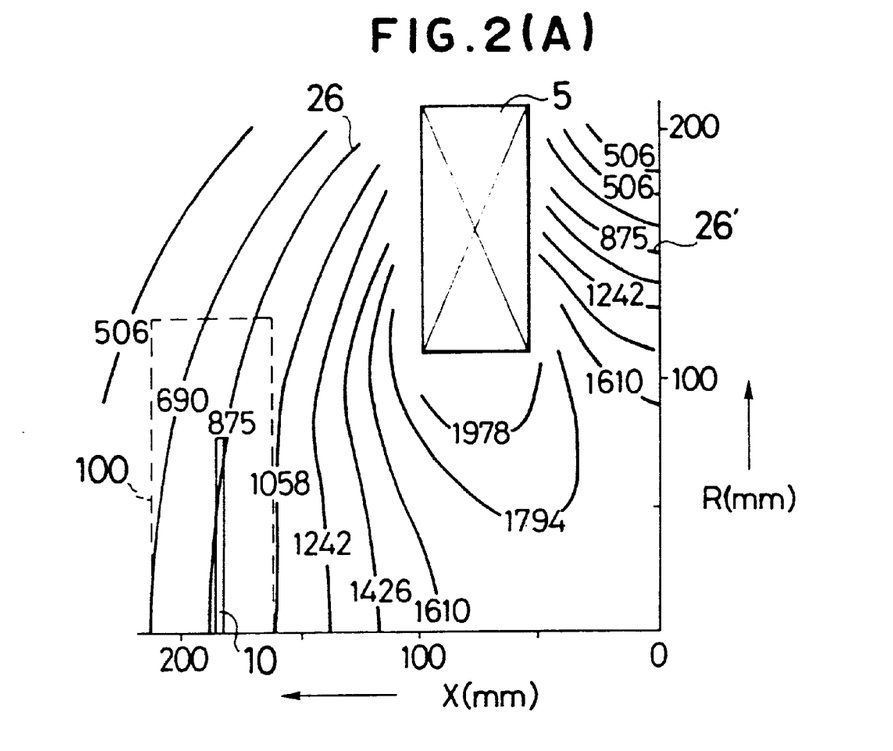
FIG. 2(A) is a graphical diagram showing the profile of the equipotential surfaces of magnetic field in cross section.
Figure 2B:
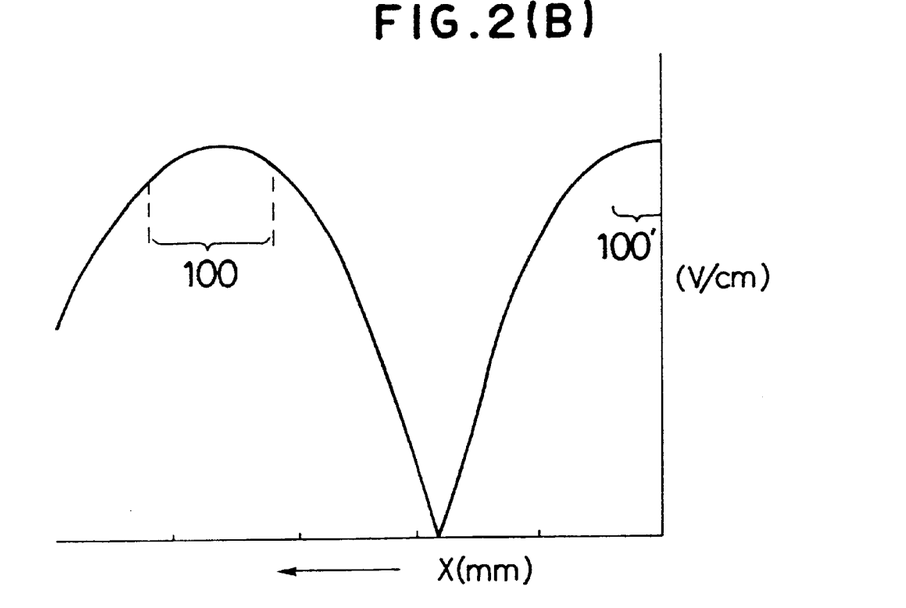
FIG. 2(B) is a graphical diagram showing the strength of electric field.
Figure 3A:
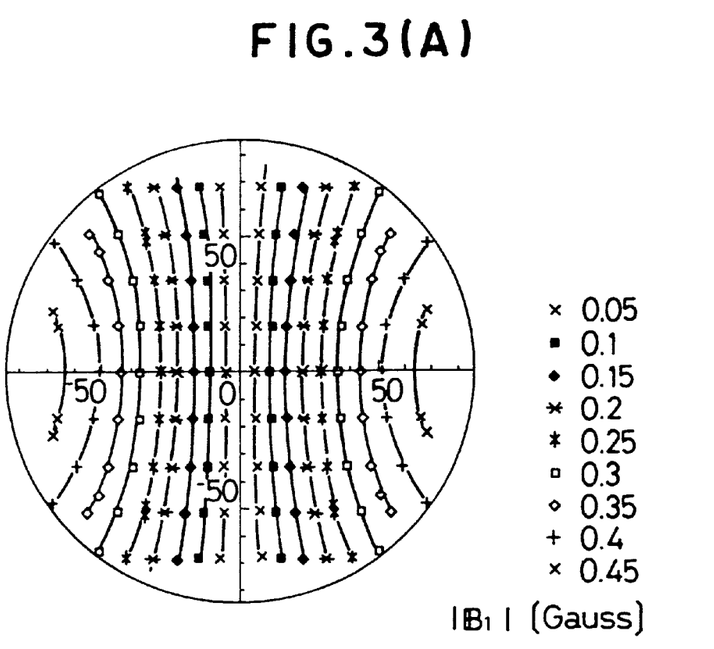
FIGS. 3(A) and 3(B) are graphical diagrams showing equipotential surfaces in terms of magnetic field and electric field respectively.
Figure 3B:
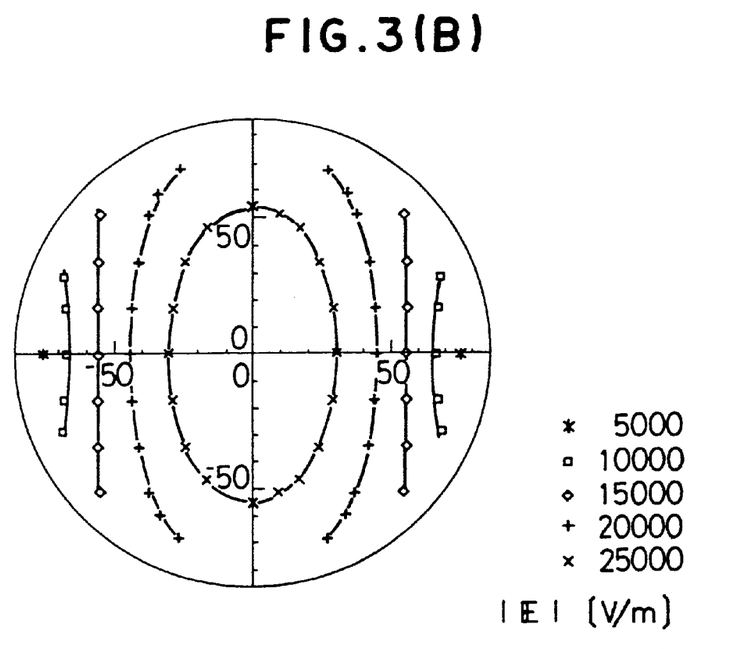

FIG. 2(A) is a graphical diagram showing the distribution of magnetic field on the region 30 in FIG. 1. Curves on the diagram are plotted along equipotential surfaces and marked with the strength values of the magnetic field induced by the magnet 5 having a power of 2000 Gauss. By adjusting the power of the magnets 5 and 5', the strength of the magnetic field can be controlled so that the magnetic field becomes largely uniform over the surface to be coated which is located in the region 100 Where the magnetic field (875±185 Gauss) and the electric field interact. In the diagram, a reference 26 designates the equipotential surface of 875 Gauss at which ECR (electron cyclotron resonance) condition between the magnetic field and the frequency of the microwave is satisfied. Of course, in accordance with the present invention, ECR can not be established due to the high pressure in the reaction chamber, 1–800 Torr, but instead a mixed cyclotron resonance (MCR) takes place in a broad region including the equipotential surface of the ECR condition. FIG. 2(B) is a graphical diagram corresponding to FIG. 2(A) and shows the strength of electric field of the microwave in the plasma generating space 1. The strength of the electric field takes its maximum value in the regions 100 and 100'. However, in the region 100', it is difficult to heat the substrate 10' without disturbing the propagation of the microwave. In other regions, a film is not uniformly deposited, but deposited in the form of a doughnut. It is for this reason that the substrate 10 is disposed in the region 100. The plasma flows in the lateral direction. According to an experiment, a uniform film can be formed on a circular substrate having a diameter of less than 100 mm. Preferably, a film is formed in the chamber on a circular substrate having a diameter of less than 50 mm with a uniform thickness and a uniform quality. When a larger substrate is desired to be coated, the diameter of the space 1 can be doubled by making use of 1.225 GHz as the frequency of the microwave. FIGS. 3(A) and 3(B) are graphical diagrams showing the distributions of the magnetic field and the electric field on a cross section of the plasma generating space 1. The curves plotted in the circles of the figures correspond equipotential surfaces. As shown in FIG. 3(B), the electric field reaches its maximum value at 25 KV/m.

The diffraction images of films formed in accordance with the present invention were obtained. As results, halo patterns were observed together with spots indicating the existence of diamond. The halo patterns, which correspond to an amorphous state, gradually disappear as the substrate temperature, increases, and when the temperature rises beyond 650° C. the film became a diamond. At less than 150° C., i-carbon film could not be formed. For reference, a film formation process was performed in the same manner as in the above but without using a magnetic field. As a result, a graphite film was deposited.

In the same manner, polycrystalline silicon carbide films and aluminum nitride films can be respectively formed by making use of methyl silane, and aluminum compound gas and ammonia gas respectively as the reactive gases. Further, other films having high melting points of tungsten, titanium, molybdenum or their silicon compounds can be formed in a similar manner.

Figure 4:
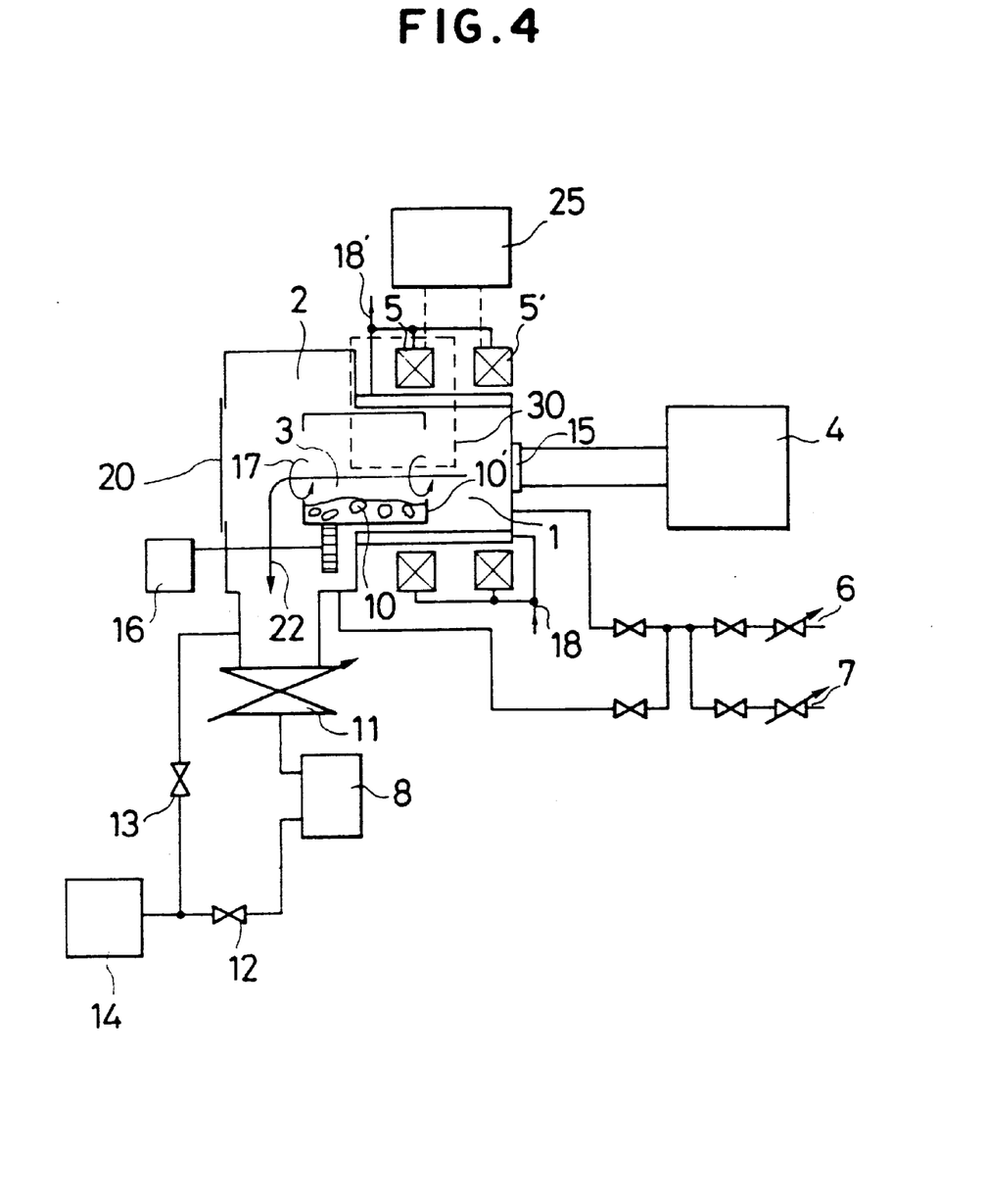
FIG. 4 is a cross section view showing another embodiment in accordance with the present invention.

Referring to FIG. 4, another embodiment of the invention is illustrated. In the figure, the apparatus comprises a reaction chamber in which a plasma generating space 1 and an auxiliary space 2 are defined and can be held at an appropriate pressure, a microwave generator 4, electro-magnets 5 and 5' which are supplied with electric power from a power supply 25, and a water cooling system 18. The plasma generating space 1 has a circular cross section. In the plasma generating space 1, a hollow cylinder 10' having inward-turned brims is rotatably supported in the space so that a microwave emitted from the microwave generator 4 passes through the cylinder along its axis. The cylinder 10' is made of a stainless steel or quartz and turned by means of a motor 16 through a gear. Provided for evacuating the reaction chamber is an evacuating system comprising a turbo molecular pump 8 and a rotary pump 14 which are connected with the reaction chamber through pressure controlling valves 11, 12 and 13. The process with this apparatus is carried out as follows.

Objects 10 to be coated, for example, metallic, plastic, ceramic parts (such as gears, screws, ornament jigs, or micro-particles for grinding) are put in the cylinder 10' and rotated at 0.1–10 rpm during the process. The cylinder 10', although the means is not illustrated in the figure, is shaken vibrated by a micro-vibration of 100 Hz–10 KHz. By the rotation and the vibration, the surfaces of the objects exposed to the surrounding ambient are always changing during the process. The reaction chamber is evacuated by the turbo molecular pump 8 and the rotary pump to $1 \times 10^{-6}$ Torr or lower. Then, argon, helium or hydrogen as a non-productive gas is introduced to the reaction chamber from a gas introducing system 6 at 30 SCCM, and a microwave of 2.45 GHz is emitted from the microwave generator at 500 W through a microwave introduction window 15 to the plasma generating space 1 which is subjected to an magnetic field of about 2 K Gauss induced by the magnets 5 and 5'. The pressure of the non-productive gas is $1 \times 10^{-4}$ Torr. A plasma is generated in the space 1 at a high density by the energy of the microwave. The surfaces of the objects 10 is cleaned by high energy electrons and non-productive atoms. In addition to the introduction of nonproductive gas, $C_2H_2$, $C_2H_4$ and/or $CH_4$ are introduced through a introduction system 7 at 1–800 Torr, preferably 3–30 Torr, e.g., 10 Torr, and excited by the energy of microwave in the same manner as carried out with the non-productive gas explained in the foregoing description. As a result of a mixed resonance, carbon is deposited in the form of a diamond film or an i-carbon film on the objects 10. In this embodiment, a heating means as illustrated in FIG. 1 may be used as in FIG. 1.

The distributions of magnetic field and electric field are same as FIGS. 2(A), 2(B), 3(A) and 3(B) explained in conjunction with the preceding embodiment and therefore redundant description is dispensed with.

The diffraction images of films formed in accordance with the present invention were obtained. As results, halo patterns were observed together with spots indicating the existence of diamond. The halo patterns gradually disappear as the substrate temperature elevates, and when the temperature rises beyond 650° C. the film became a diamond. At less than 150° C., i-carbon film could not be formed. For reference, a film formation process was performed in the same manner as in the above but without using a magnetic field. As a result, a graphite film was deposited.

In the same manner, polycrystalline silicon carbide filmse and aluminum nitride films can be respectively formed by making use of methylsilane and an aluminum compound gas and ammonia gas as the reactive gases. Further, other films having high melting points of tungsten, titanium, molybdenum or their silicon compounds can be formed in a similar manner. For example, a BN or BP film could be formed in accordance with the present invention.

The pressure in the reaction chamber is chosen at that required for ECR condition, so that a preliminary plasma discharge takes place. While the discharge continues, the pressure is changed to 1 Torr to $3 \times 10^{-3}$. Torr where a mixed resonance takes place with a plasma of which particles have a mean free path of 0.05 mm to several milimeters, normally not more than 1 mm.

The process proposed by this invention is suitable for manufacturing superconductig ceramics including one or more rare earth elements, one or more alkaline earth element (including Be and Mg) and Cu. In this case, a process gas is prepared by bubbling a solution of compounds of the elements with oxygen gas. For example, an organic solution (benzene, or alcohol solution) or a water solution of alkylenes or halides of $Y(OC_2H_5)_3$, $Ba(OC_2H_5)_3$ and $CuBr_3$ so that the stoichometric ratio among Y, Ba and Cu is 1:2:3. The stoichometric formula of the deposited product is $YBa_2Cu_3O_{6-8}$. In place of the bubbling method, compounds of the elements can be inputted to the rection chamber by blowing the compounds in the form of fine powder with a highly pressurized oxygen gas, that is by the so called spraying method.

The invention should not be limited to the above particular embodiments and many modifications and variations may occur to those skilled in the art. For example, instead of the hollow cylinder, any hollow member having a cross section of a polygon can be employed. Although the embodiments employ microwave energy alone under the exsitence of magnetic field, photon energy can be applied to the reactive gas excited by the mixed resonance, an a position separated from the mixed resonance.

What is claimed is:

1. A plasma chemical vapor reaction method capable of cyclotron resonance comprising the steps of:
   inputting a reactive gas into a reaction chamber;
   emitting microwaves into said reaction chamber at a frequency through a window in a direction of propagation;
   establishing a magnetic field in said reaction chamber where the magnetic field is directed substantially parallel to the direction of propagation of the microwaves and has a strength sufficient to cause cyclotron resonance at a position in the reaction chamber;
   exhausting the reaction chamber to establish a predetermined pressure in the chamber; and
   holding a substrate located substantially at said position in the reaction chamber on a holder, wherein the strength of the magnetic field decreases along a line extending through said substrate in the direction of propagation of the microwaves.

2. A method as in claim 1 wherein the exhausting means is effected by at least a turbo-molecular pump.

3. A method as in claim 1 where said cyclotron resonance is mixed cyclotron resonance.

4. The plasma chemical vapor reaction method according to claim 1 wherein said substrate is arranged in said reaction chamber so that a major surface of said substrate is orthogonal to the direction of propagation of the microwaves.

5. The plasma chemical vapor reaction method according to claim 1 wherein said reaction chamber is exhausted through an outlet port provided in said reaction chamber, said outlet port being located on an opposite side of said substrate with respect to said window.

6. A plasma chemical vapor reaction method capable of cyclotron resonance comprising the steps of:
   inputting a reactive gas into a reaction chamber;
   emitting microwaves into said reaction chamber at a frequency in a direction of propagation;
   establishing a standing wave of said microwaves therein, said standing wave having a maximum value at a position in the reaction chamber;
   holding an object to be treated being located substantially at said position on a holder;
   establishing a magnetic field in said reaction chamber where the magnetic field is substantially parallel to the direction of propagation of the microwaves and has a strength sufficient to cause cyclotron resonance in the reaction chamber; and
   exhausting said reaction chamber to a predetermined pressure;
   wherein the strength of the magnetic field decreases along a line extending through the substrate in the direction of propagation of the microwaves.

7. A method as in claim 6 wherein the exhausting is effected by at least a turbo-molecular pump.

8. A method as in claim 6 where said establishing the magnetic field causes said cyclotron resonance to occur approximately at the position where the object is held.

9. A method as in claim 6 where said cyclotron resonance is mixed cyclotron resonance.

10. The method of claim 1 or 6 further comprising controlling temperature of said substrate.

11. The method of claim 10 where said temperature is controlled by an infrared heater.

12. The method of claim 10 wherein said infrared heater is focused on said substrate from a back side of said holder.

13. The method of claim 12 wherein said reaction chamber includes a cylindrical wall.

14. The method of claim 1 or 13 wherein said method is for forming a coating on said substrate, said coating comprising a material selected from the group consisting of diamond, a mixture of diamond and amorphous carbon, boron nitride, aluminum nitride and boron phosphorous.

15. The method of claim 1 or 6 wherein said magnetic field is established by at least Hehnholtz coils.

16. The method of claim 1 or 6 wherein the frequency of said microwave is 1.225 GHz or 2.45 GHz.

17. The plasma chemical vapor reaction method according to claim 6 wherein said substrate is arranged in said reaction chamber so that a major surface of said substrate is orthogonal to the direction of propagation of the microwaves.

18. A plasma chemical vapor reaction method capable of cyclotron resonance comprising the steps of:
   inputting a reactive gas into a reaction chamber;
   emitting microwaves having a frequency into said reaction chamber in a direction of propagation where the frequency of the microwaves are 2.45 GHz;
   establishing a magnetic field in said reaction chamber having a strength sufficient to cause a cyclotron resonance in said reaction chamber;
   exhausting the reaction chamber; and
   positioning a substrate at a location where the strength of the magnetic field is 875 Gauss±185 Gauss, and
   wherein the strength of the magnetic field decreases along a line extending through the substrate in the direction of propagation of the microwaves.

19. The plasma chemical vapor reaction method according to claim 18 wherein said substrate is arranged in said reaction chamber so that a major surface of said substrate is orthogonal to the direction of propagation of the microwaves.

20. A plasma chemical vapor reaction method capable of cyclotron resonance comprising the steps of:
   inputting a reaction gas into a reaction chamber;
   emitting microwaves having a frequency of 2.45 GHz into said reaction chamber in a direction of propagation wherein a standing wave of said in microwave is established at a position in said reaction chamber;

establishing a magnetic field in said reaction chamber having a strength sufficient to establish a cyclotron resonance in said chamber;

exhausting the reaction chamber; and holding a substrate positioned at a location at said position where the strength of said magnetic field is 875 Gauss+ 185 Gauss, and wherein the strength of the magnetic field decreases along a line extending through the substrate in the direction of propagation of the microwaves.

21. The plasma chemical vapor reaction method according to claim 20 wherein said substrate is arranged in said reaction chamber so that a major surface of said substrate is orthogonal to the direction of propagation of the microwaves.

22. A method of forming a film comprising the steps of:

inputting a reactive gas into a reaction chamber;

emitting microwaves into said reaction chamber at a frequency through a window in a direction of propagation;

establishing a magnetic field in said reaction chamber where the magnetic field is directed substantially parallel to the direction of propagation of the microwaves and has a strength sufficient to cause cyclotron resonance at a position in the reaction chamber;

exhausting the reaction chamber to establish a predetermined pressure in the chamber;

holding a substrate located substantially at said position in the reaction chamber on a holder, wherein the strength of the magnetic field decreases along a line extending through said substrate in the direction of propagation of the microwaves; and forming a film over said substrate by using the reactive excited by the cyclotron resonance.

23. The method as in claim 22 wherein the exhausting step is effected by at least a turbo-molecular pump.

24. The method as in claim 22 wherein said cyclotron resonance is a mixed cyclotron resonance.

25. The method according to claim 22 wherein said substrate is arranged in said reaction chamber so that a major surface of said substrate is orthogonal to the direction of propagation of the microwaves.

26. The method according to claim 22 wherein said reaction chamber is exhausted through an outlet port provided in said reaction chamber, said outlet port being located on an opposite side of said substrate with respect to said window.

27. A method of forming a film comprising the steps of:

inputting a reactive gas into a reaction chamber;

emitting microwaves into said reaction chamber at a frequency in a direction of propagation;

establishing a standing wave of said microwaves therein, said standing wave having a maximum value at a position in the reaction chamber;

holding an object to be treated being located substantially at said position on a holder;

establishing a magnetic field in said reaction chamber where the magnetic field is substantially parallel to the direction of propagation of the microwaves and has a strength sufficient to cause cyclotron resonance in the reaction chamber;

exhausting said reaction chamber to a predetermined pressure; and forming a film on said object by using the reactive gas excited by the cyclotron resonance, wherein the strength of the magnetic field decreases along a line extending through the substrate in the direction of propagation of the microwaves.

28. The method as in claim 27 wherein the exhausting step is effected by at least a turbo-molecular pump.

29. The method as in claim 27 wherein said establishing a magnetic field step causes said cyclotron resonance to occur approximately at the position where the object is held.

30. The method as in claim 27 wherein said cyclotron resonance is a mixed cyclotron resonance.

31. The method of claim 22 or 27 wherein said film comprises a material selected from the group consisting of diamond, a mixture of diamond and amorphous carbon, and aluminum nitride.

32. The method of claim 22 or 27 further comprising controlling the temperature of said substrate or object.

33. The method of claim 32 wherein said temperature is controlled by an infrared heater.

34. The method of claim 33 wherein said infrared heater is focused on said substrate from a back side of said holder.

35. The method of claim 22 or 27 wherein said magnetic field is established by at least Helmholz coils.

36. The method of claim 22 or 27 wherein the frequency of said microwave is 1.225 GHz or 2.45 GHz.

37. The method according to claim 27 wherein said substrate is arranged in said reaction chamber so that a major surface of said substrate is orthogonal to the direction of propagation of the microwaves.

38. A method of forming a film comprising the steps of:

inputting a reactive gas into a reaction chamber;

emitting microwaves having a frequency into said reaction chamber in a direction of propagation where the frequency of the microwaves are 2.45 GHz;

establishing a magnetic field in said reaction chamber having a strength sufficient to cause a cyclotron resonance in said reaction chamber;

exhausting the reaction chamber;

positioning a substrate at a location where the strength of the magnetic field is 875 Gauss±185 Gauss; and forming a film over said substrate by using the reactive gas excited by said cyclotron resonance, wherein the strength of the magnetic field decreases along a line extending through the substrate in the direction of propagation of the microwaves.

39. The method according to claim 38 wherein said substrate is arranged in said reaction chamber so that a major surface of said substrate is orthogonal to the direction of propagation of the microwaves.

40. A method of forming a film comprising the steps of:

inputting a reaction gas into a reaction chamber;

emitting microwaves having a frequency of 2.45 GHz into said reaction chamber in a direction of propagation wherein a standing wave of said in microwave is established at a position in said reaction chamber;

establishing a magnetic field in said reaction chamber having a strength sufficient to establish a cyclotron resonance in said chamber;

exhausting the reaction chamber;

holding a substrate positioned at a location at said position where the strength of said magnetic field is 875 Gauss+ 185 Gauss; and forming a film over said substrate by using the reactive gas excited by the cyclotron resonance, wherein the strength of the magnetic field decreases along a line extending through the substrate in the direction of propagation of the microwaves.

41. The method according to claim 40 wherein said substrate is arranged in said reaction chamber so that a major surface of said substrate is orthogonal to the direction of propagation of the microwaves.

42. The method according to any one of claims 22, 27, 38 and 40 wherein said film comprises carbon.

43. The method according to any one of claims 22, 27, 38 and 40 wherein said film comprises diamond.

* * * * *